(12) United States Patent
Sheng et al.

(10) Patent No.: US 11,791,446 B2
(45) Date of Patent: Oct. 17, 2023

(54) MICRO-DEVICE WITH STRENGTHENED CONNECTING LAYERS

(71) Applicant: XIAMEN SAN'AN OPTOELECTRONICS CO., LTD.

(72) Inventors: Cui-Cui Sheng, Tianjin (CN); Du-Xiang Wang, Tianjin (CN); Bing-Xian Chung, Tianjin (CN); Chun-Yi Wu, Tianjin (CN); Chao-Yu Wu, Xiamen (CN)

(73) Assignee: XIAMEN SAN'AN OPTOELECTRONICS CO., LTD., Fujian (CN)

(*) Notice: Subject to any disclaimer, the term of this patent is extended or adjusted under 35 U.S.C. 154(b) by 0 days.

(21) Appl. No.: 16/579,736

(22) Filed: Sep. 23, 2019

(65) Prior Publication Data
US 2020/0020840 A1    Jan. 16, 2020

Related U.S. Application Data

(63) Continuation-in-part of application No. PCT/CN2018/078704, filed on Mar. 12, 2018.

(30) Foreign Application Priority Data

Apr. 18, 2017  (CN) .......................... 201710253226.6

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01); *H01L 2933/0066* (2013.01)

(58) Field of Classification Search
CPC ....... H01L 33/005; H01L 33/06; H01L 33/62; H01L 27/15; H01L 25/0753; H01L 2933/0066
See application file for complete search history.

(56) References Cited

U.S. PATENT DOCUMENTS 11,101,417 B2 * 8/2021 Bower .................... H01L 24/95
2005/0248264 A1 * 11/2005 Cok ...................... H01L 27/3269
                                                              313/504

(Continued)

FOREIGN PATENT DOCUMENTS

| CN | 104661953 A | 5/2015 |
| CN | 105129259 A | 12/2015 |
| CN | 107068665 A | 8/2017 |

OTHER PUBLICATIONS

Search Report issued to PCT application No. PCT/CN2018/078704 by the CNIPA dated Jun. 15, 2018.

*Primary Examiner* — Didarul A Mazumder
*Assistant Examiner* — Gustavo G Ramallo
(74) *Attorney, Agent, or Firm* — DLA PIPER LLP (US)

(57) ABSTRACT

A micro device includes a securing layer, a plurality of micro device units that are separated from each other and that are spaced apart from the securing layer, and a connecting layer that interconnects the micro device units in at least one group of two or more and that is connected to the securing layer so that the micro device units are connected to the securing layer through the connecting layer. A method of making the micro device is also provided.

8 Claims, 16 Drawing Sheets

(56) References Cited

U.S. PATENT DOCUMENTS

| | | | | |
|---|---|---|---|---|
| 2005/0253155 | A1* | 11/2005 | Wirth | H01L 33/62 |
| | | | | 257/88 |
| 2007/0086211 | A1* | 4/2007 | Beeson | H01L 33/60 |
| | | | | 362/628 |
| 2008/0067534 | A1* | 3/2008 | Hsieh | H01L 33/64 |
| | | | | 257/98 |
| 2009/0045435 | A1* | 2/2009 | Yao | H01L 33/22 |
| | | | | 257/103 |
| 2014/0070245 | A1* | 3/2014 | Haberern | H01L 33/405 |
| | | | | 257/93 |
| 2016/0315068 | A1* | 10/2016 | Lee | H01L 33/62 |
| 2016/0336304 | A1* | 11/2016 | Wu | H01L 21/6835 |
| 2017/0025563 | A1 | 1/2017 | Meitl et al. | |
| 2018/0068160 | A1* | 3/2018 | Wu | G06K 9/00201 |
| 2018/0138071 | A1* | 5/2018 | Bower | H01L 33/38 |

* cited by examiner

MICRO-DEVICE WITH STRENGTHENED CONNECTING LAYERS

CROSS-REFERENCE TO RELATED APPLICATION

This application is a continuation-in-part (CIP) of International Application No. PCT/CN2018/078704, filed on Mar. 12, 2018, which claims priority to Chinese Invention Patent Application No. 201710253226.6, filed Apr. 18, 2017.

FIELD

The disclosure relates to a micro device, more particularly to a micro device with a connecting layer.

BACKGROUND

Micro device technology refers to the formation of a high-density array of microscopic components on a substrate. Some examples of micro devices include a micro-electromechanical system (MEMS) micro switch, a light emitting diode (LED) display system, and oscillators based on MEMS or quartz technologies. Currently, micro LED technology is a popular area for research and the industry is expecting high quality micro device products to enter the market. High quality micro LED products would have a large impact on traditional display products on the market that uses liquid crystal display (LCD) or organic LED (OLED) display.

Chinese Patent Publication No. CN105359283A discloses a micro device with stabilization post, wherein an array of the stabilization posts is disposed below an array of micro devices to support the micro devices. However, the connection between the stabilization posts and conductive contacts of the micro devices is not very strong, and after the production of the micro devices and before collection, mechanical movements or other outside factors could cause the micro devices to detach from the stabilization posts.

SUMMARY

Therefore, the object of the disclosure is to provide a micro device that can alleviate drawbacks of the prior art. A method of making the micro device is also provided.

According to one aspect of the disclosure, a micro device including a securing layer, a plurality of micro device units that are separated from each other and that are spaced apart from the securing layer, and a connecting layer that interconnects the micro device units in at least one group of two or more and that is connected to the securing layer so that the micro device units are connected to the securing layer through the connecting layer.

According to another aspect of the disclosure, a method for making a micro device includes the steps of:

forming a plurality of micro device units that are separated from each other, and are interconnected in at least one group of two or more through a connecting layer; and forming a securing layer that is connected to the connecting layer and spaced apart from the plurality of micro device units.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
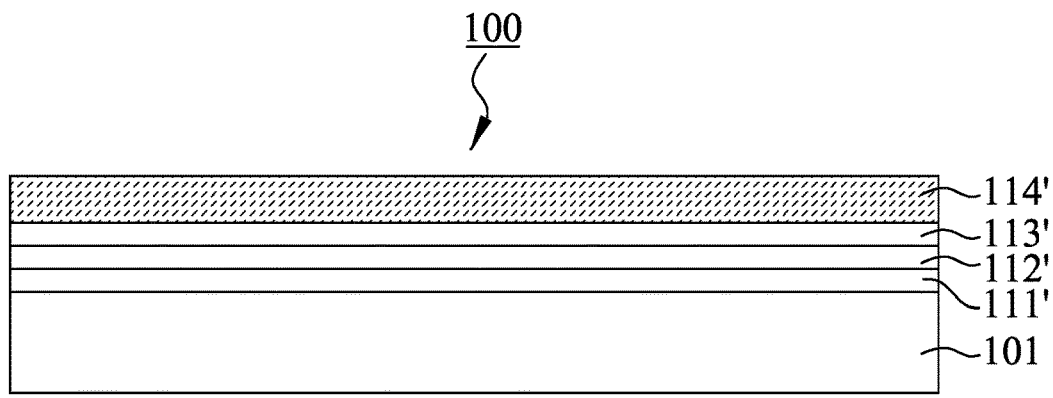
FIGS. 1 to 20 are schematic process diagrams illustrating an embodiment of a method of making a micro device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 20:
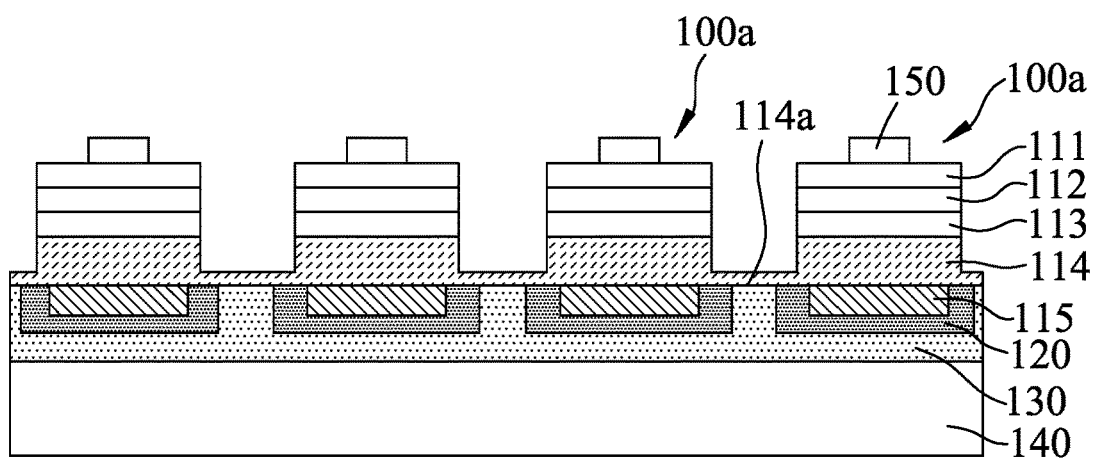

An embodiment of a method of making a micro device is disclosed. Referring to FIG. 20, the method includes the steps of:

forming a plurality of micro device units 100a that are separated from each other, and are interconnected in at least one group of two or more through a connecting layer 114a; and forming a securing layer 130 that is connected to the connecting layer 114a and spaced apart from the plurality of micro device units 100a.

Specifically, the method includes steps 1 to 6. In step 1, a semiconductor epitaxial structure 100 as shown in FIG. 1 is provided. The semiconductor epitaxial structure 100 has a plurality of layers including a growth substrate 101, an n-type semiconductor film 111', a light emitting film 112', a p-type semiconductor film 113' and a window film 114'. Optionally, an etch stop layer (not shown) can be formed between the growth substrate 101 and the n-type semiconductor film 111' to aid in removal of the growth substrate 101 in later steps.

In certain embodiments, the growth substrate 101 is made of gallium arsenide (GaAs), the etch stop layer is made of indium gallium phosphide (InGaP), the n-type semiconductor film 111' is made of aluminum gallium arsenide (AlGaAs) with the structural formula of $Al_{x1}Ga_{1-x1}As$, where x1 is larger than 0.4, or aluminum gallium indium phosphide (AlGaInP) with the structural formula of $(Al_{x2}Ga_{1-x2})_{y2}In_{1-y2}P$, wherein x2 is larger than 0.4 and y2 is 0.5, the light emitting film 112' is made of AlGaInP with the structural formula of $(Al_{x3}Ga_{1-x3})_{y3}In_{1-y3}P$, wherein x3 is smaller than 0.5 and y3 is 0.5, the p-type semiconductor film 113' is made of AlGaAs with the structural formula of $Al_{x4}Ga_{1-x4}As$, where x4 is larger than 0.4, or AlGaInP with the structural formula of $(Al_{x5}Ga_{1-x5})_{y5}In_{1-y5}P$, wherein x5 is larger than 0.4 and y5 is 0.5, and the window film 114' is made of a material such as gallium phosphide (GaP), gallium arsenide phosphide (GaAsP), AlGaAs, or AlGaInP, and has a thickness of between 1 micrometer and 10 micrometers.

Figure 2:
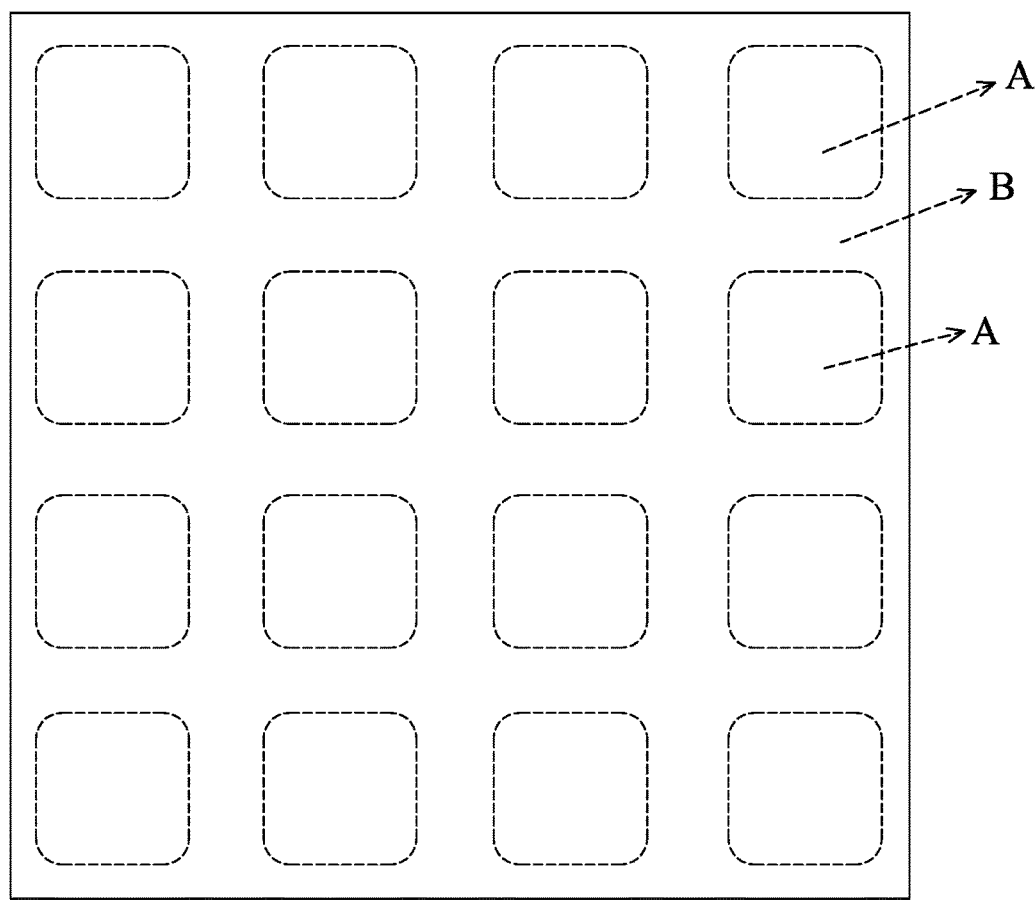
Figure 14:
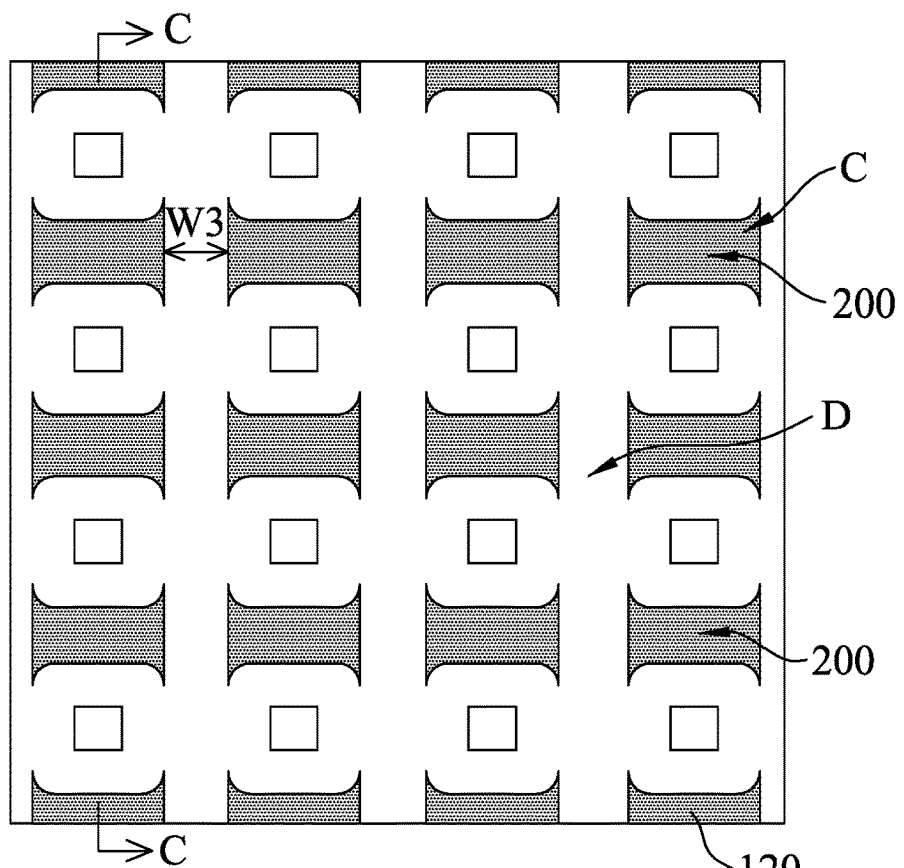

Referring to FIG. 2, in step 2, a plurality of spaced apart micro device unit regions (A) arranged in an array, and a cutting region (B) that surrounds the micro device unit regions (A) are defined on the semiconductor epitaxial structure 100. Referring further to FIG. 14, the cutting region B is divided into a to-be-removed sub-region (C) and a connecting sub-region (D).

Figure 3:
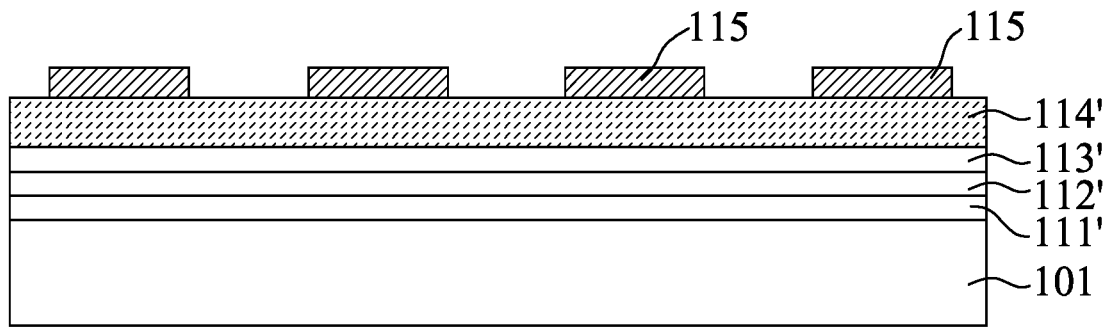

Referring to FIG. 3, in certain embodiments, an array of first electrodes 115 are respectively formed in the micro device unit regions (A) on the semiconductor epitaxial structure 100. The first electrodes 115 may be made of Au/AuZn/Au. In this step, fusion may be performed on the first electrodes 115 to produce ohmic contact between the first electrodes 115 and the epitaxial structure 100.

Figure 4:
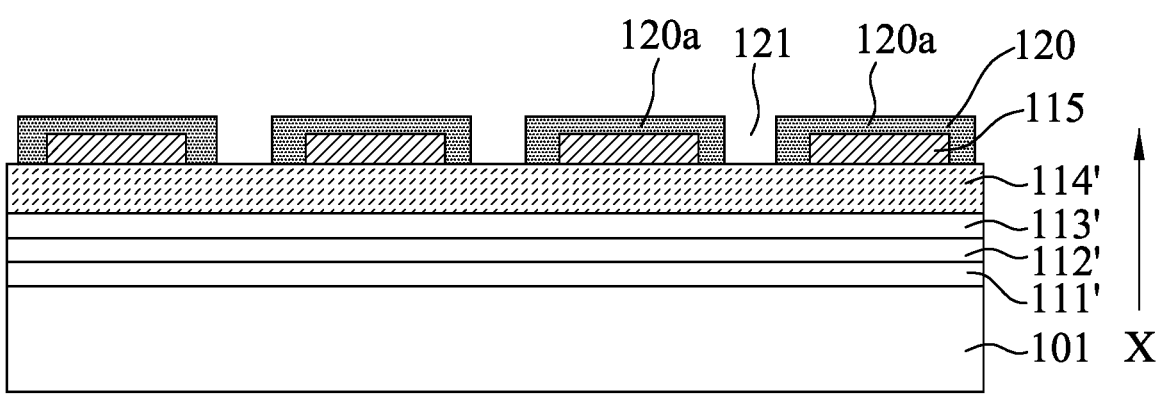
Figure 5:
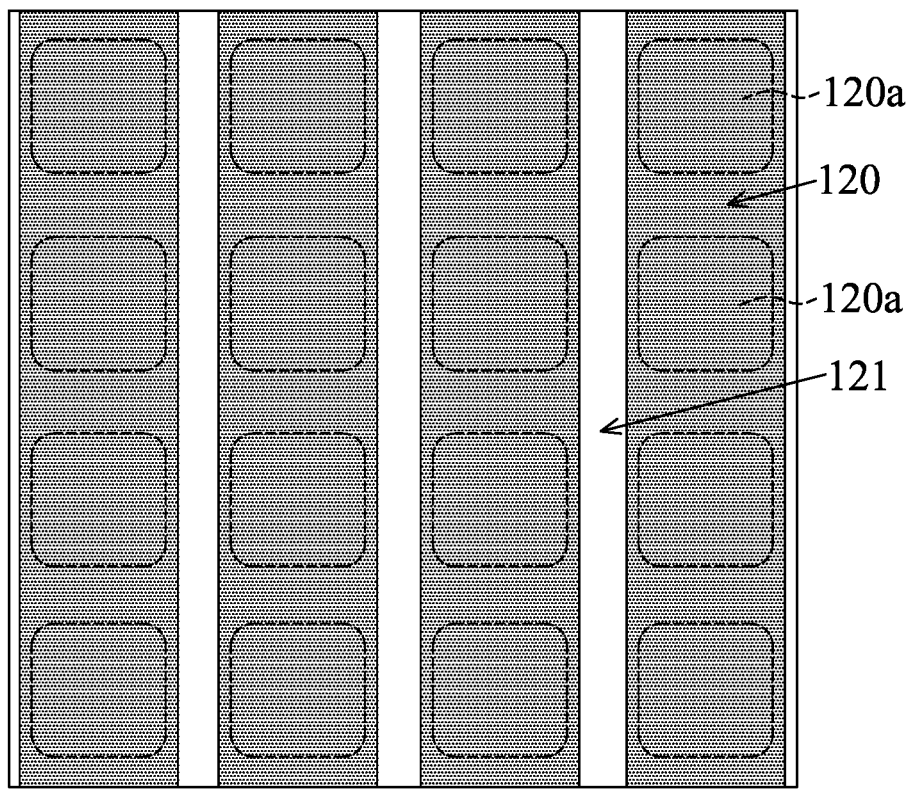

Referring to FIGS. 4 and 5, in step 3, a sacrificial layer 120 is formed on the semiconductor epitaxial structure 100 in a laminating direction (X). In certain embodiments where the first electrodes 115 are formed, the sacrificial layer 120 is formed on the first electrodes 115 and the semiconductor epitaxial structure 100. The sacrificial layer 120 has a thickness of between 0.1 micrometer and 5 micrometers and may be made of an oxide, a nitride, or another material that can be selective removed while the other layers are retained. In this embodiment, the sacrificial layer 120 is made of titanium and has a thickness of between 2 micrometers and 4 micrometers. Specifically, in this embodiment, the sacrificial layer 120 includes a plurality of sacrificial layer units 120a corresponding to the micro device unit regions (A) and has a plurality of reserved spaces 121 defined to align with the connecting sub-region (D) in the laminating direction (X). Each of the sacrificial layer units 120a of the sacrificial layer 120 has a cross-sectional area which is transverse to the laminating direction (X) and which is larger than that of the micro device unit region (A) covered by the sacrificial layer unit 120a. In other words, the sacrificial layer 120 completely covers the micro device unit regions (A), and partially covers the cutting region (B) such that the reserved spaces 121 has a cross-sectional area which is transverse to the laminating direction (X) and which is smaller than an area of a corresponding portion of the connecting sub-region (D).

Figure 6:
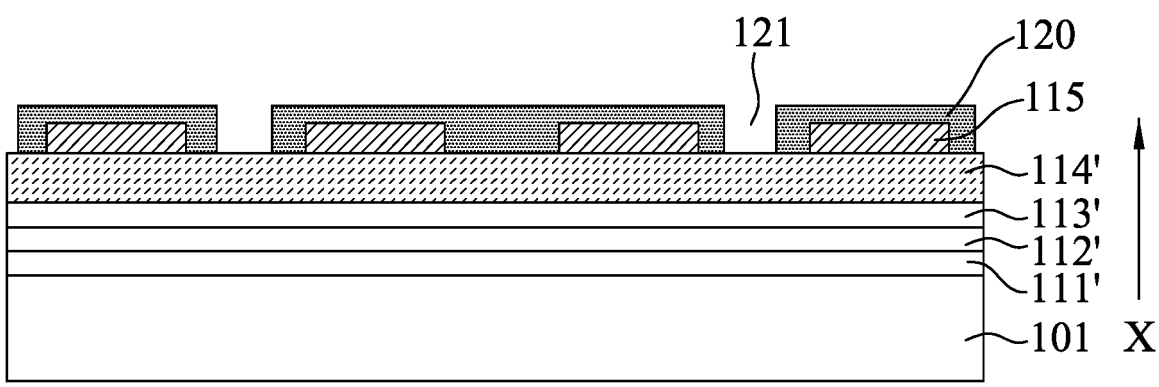
Figure 7:
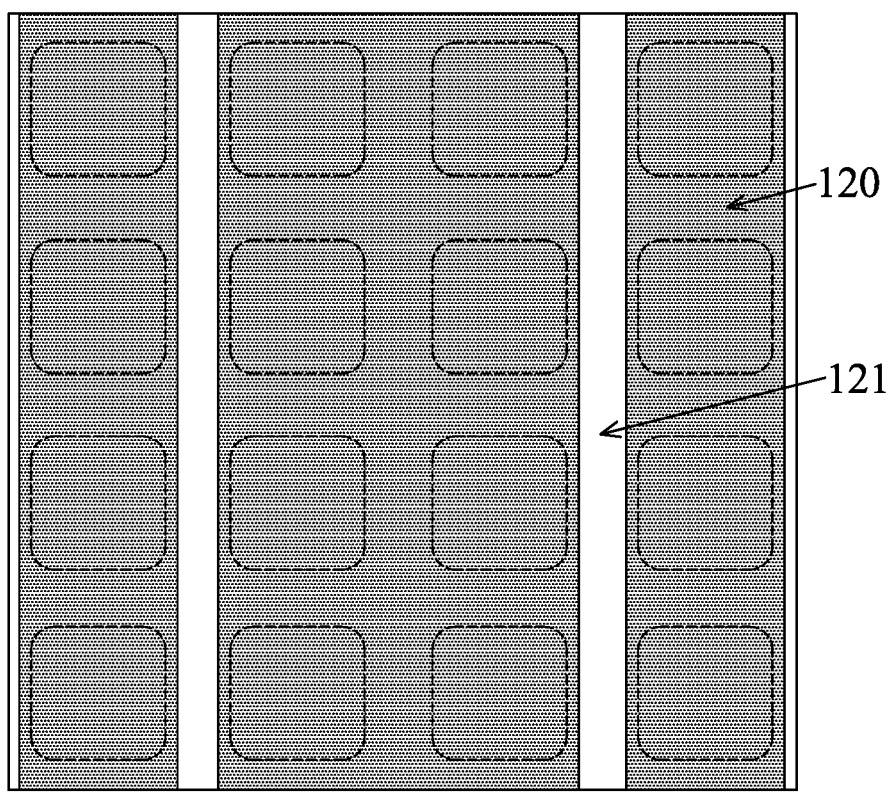
Figure 8:
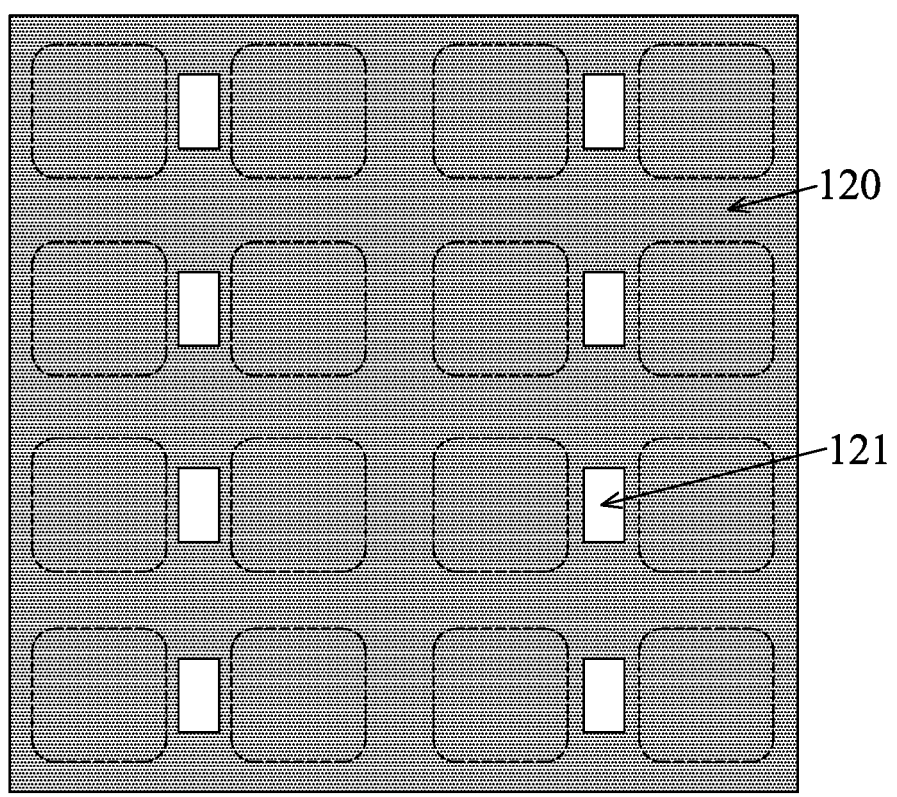
Figure 9:
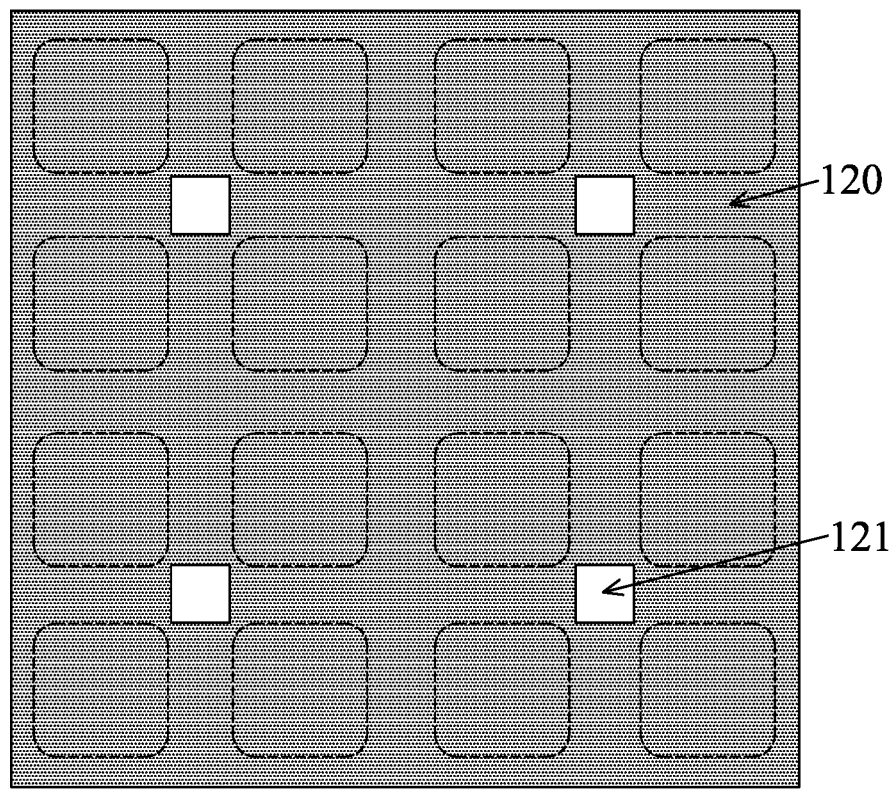

Referring to FIGS. 2 and 5, in this embodiment, each of the sacrificial layer units 120a has a striped-shape, respectively cover columns of the micro device unit regions (A), and extend into the cutting region (B). Referring further to FIGS. 6 and 7, in certain embodiments, at least one of the sacrificial layer units 120a may cover two adjacent ones of the columns of the micro device unit regions (A). Referring further to FIGS. 8 and 9, in other embodiments, the sacrificial layer 120 may be formed in one piece, with the reserved spaces 121 formed between two or four adjacent ones of the micro device unit regions (A).

Figure 10:
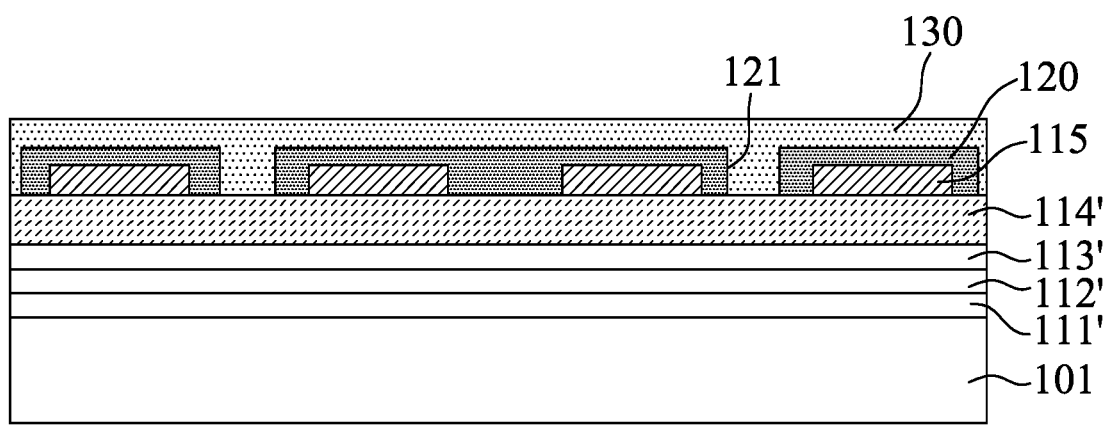
Figure 11:
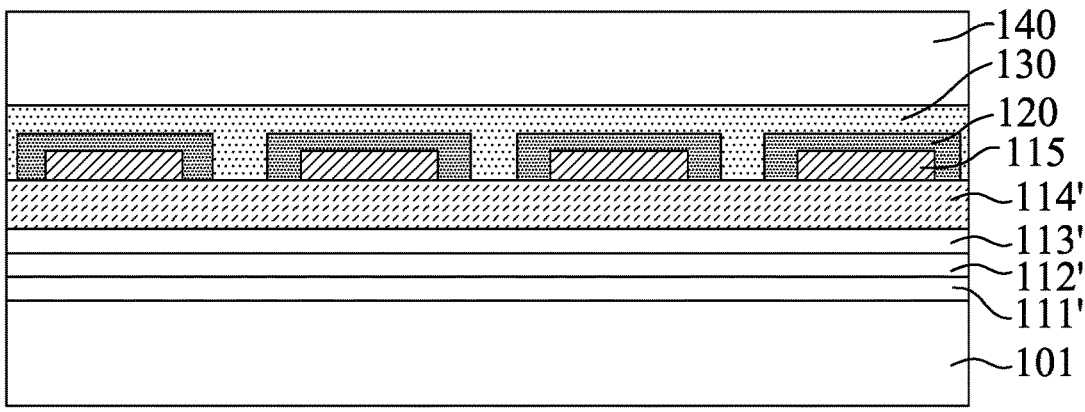

Referring to FIGS. 10 and 11, the securing layer 130 is formed on the sacrificial layer 120 and in the reserved spaces 121 of the sacrificial layer 120 in the laminating direction (X) so as to connect the securing layer 130 with the semiconductor epitaxial structure 100. The securing layer 130 is used to join the epitaxial structure 100 to a carrier substrate 140 which may be, for example, a glass, sapphire, or other flat substrates. The securing layer 130 may be made of a thermosetting adhesive material, such as, but not limited to, benzocyclobutene (BCB) or epoxy resin. Depending on the material used, the securing layer 130 may be cured thermally or using ultraviolet energy.

In this embodiment, the securing layer 130 is formed directly on the epitaxial structure 100, but in other embodiments may be formed on the carrier substrate 140 first. In yet another embodiment, BCB may be applied to both the epitaxial structure 100 and the carrier substrate 140, then hard-baked, soft-baked and bonded. In another embodiment, an adhesion promoter (e.g. AP3000 by Dow Chemical) may be applied on the epitaxial structure 100 and/or the carrier substrate 140, and then the BCB applied.

Figure 12:
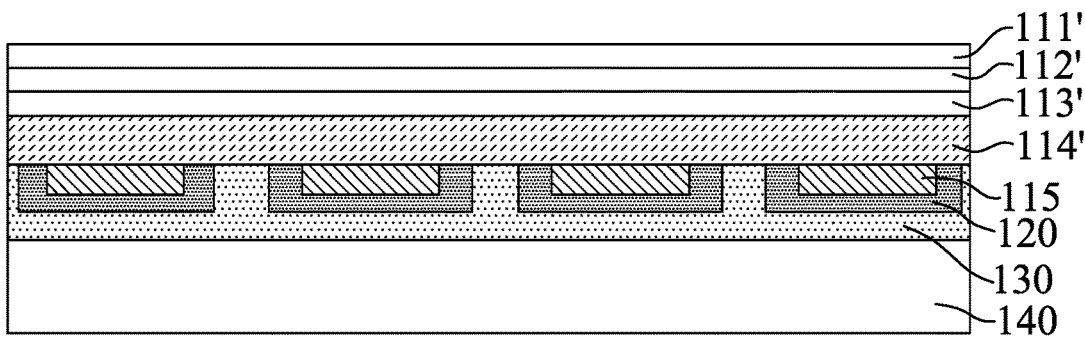

Referring to FIG. 12, the growth substrate 101 (shown in FIG. 11) is removed and the epitaxial structure 100 flipped over such that the n-type semiconductor film 111' is exposed. Depending on the material of the growth substrate 101, the removal of the growth substrate 101 may be performed using laser lift-off (LLO) techniques, grinding or etching. In this embodiment, where the growth substrate 101 is made of GaAs, etching or a combination of grinding and selective etching in cooperation with the etch stop layer may be used to perform the removal.

Figure 13:
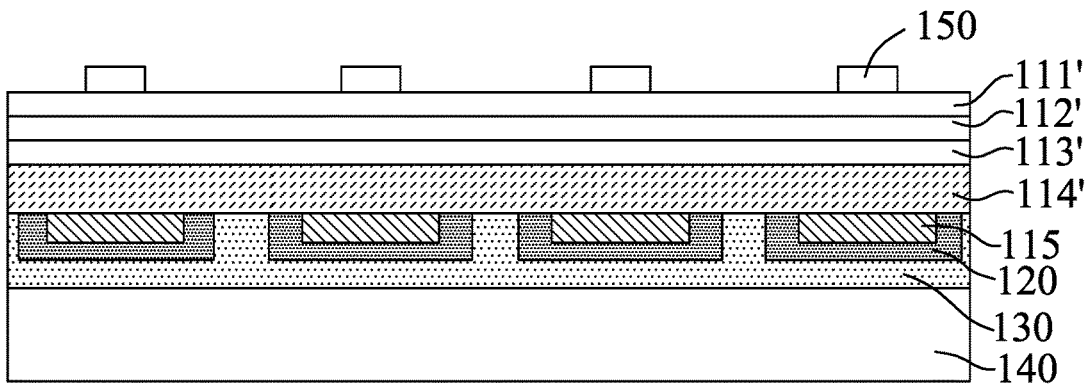

In certain embodiments, as shown in FIG. 13, a plurality of second electrodes 150 are formed in an array on the n-type semiconductor film 111' corresponding in position to the first electrodes 115, respectively.

Figure 19:
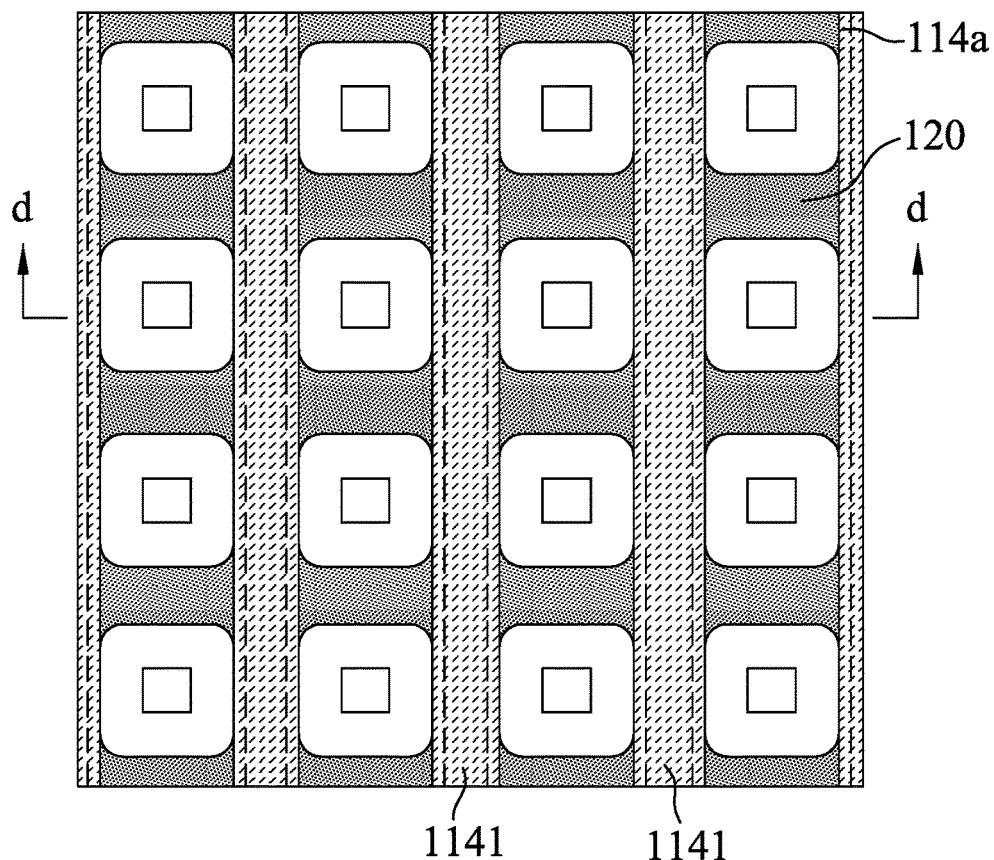

Referring to FIGS. 14 and 19, in step 5, a portion of the semiconductor epitaxial structure 100 which is in the cutting region (B) is removed from a surface of the semiconductor epitaxial structure 100 that is opposite to the sacrificial layer 120 (i.e. the n-type semiconductor film 111') to form a plurality of gaps 200 that expose the sacrificial layer 120 in the to-be-removed sub-region (C) of the cutting region (B) and the connecting layer 114a in the connecting region (D) of the cutting region (B). The connecting layer 114a interconnects the micro device unit regions (A) in groups of two or more and is connected to the securing layer 130 in the reserved spaces 121.

Figure 15:
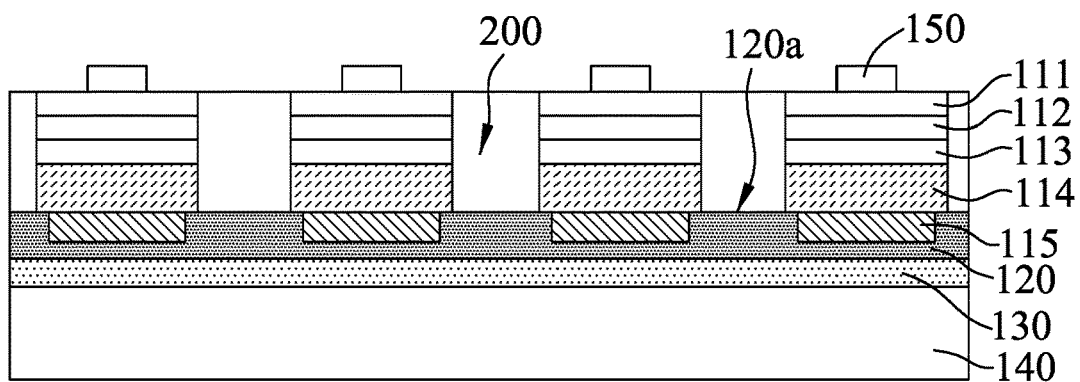
Figure 16:
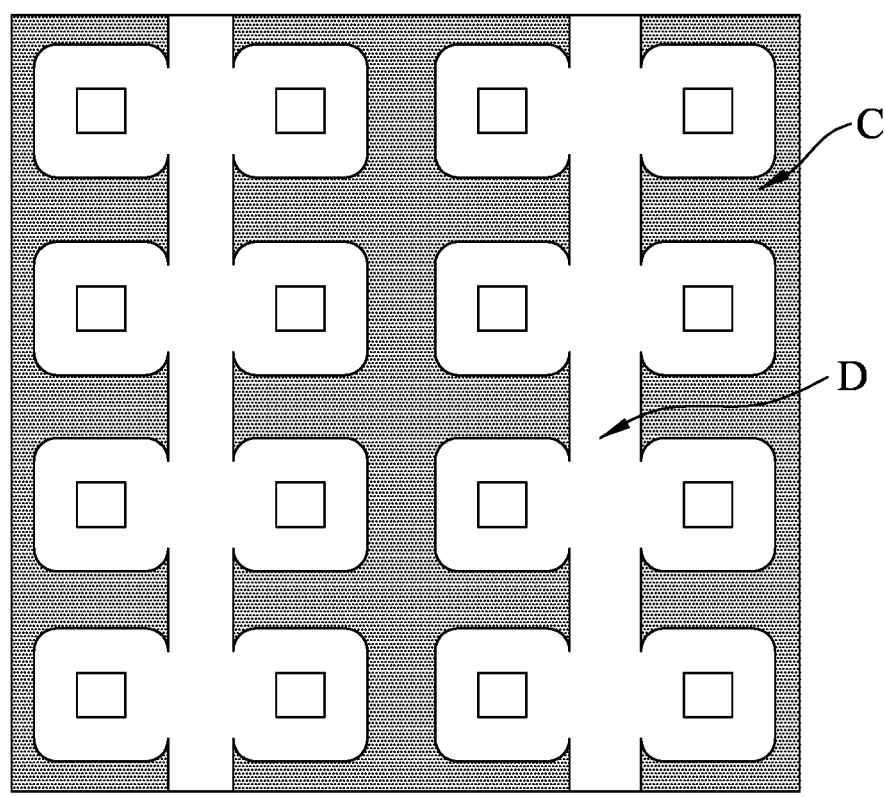
Figure 17:
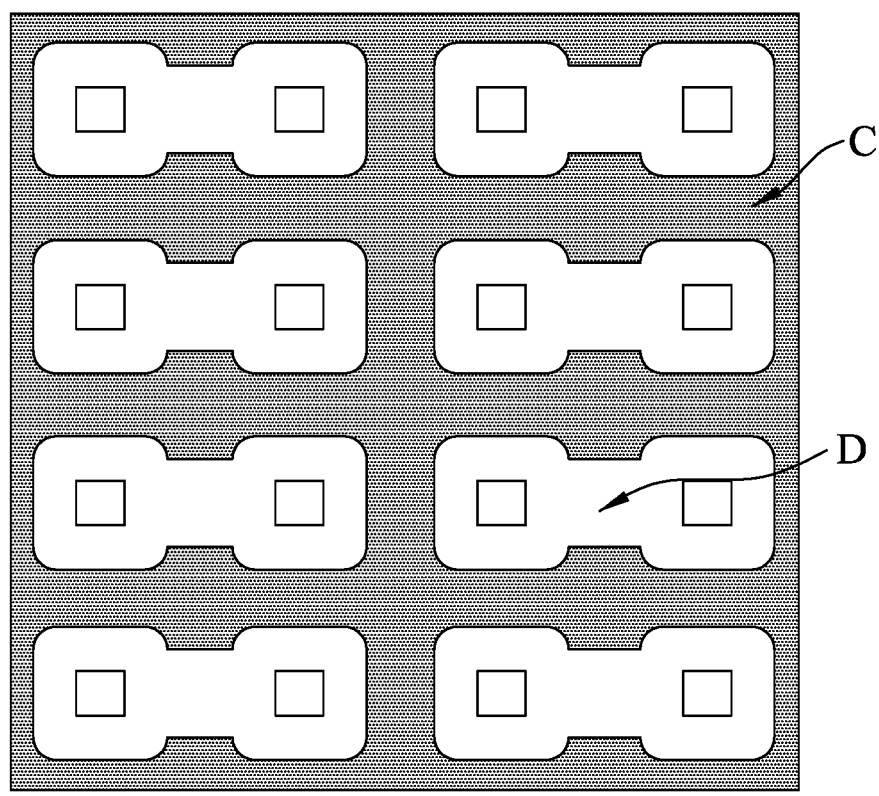
Figure 18:
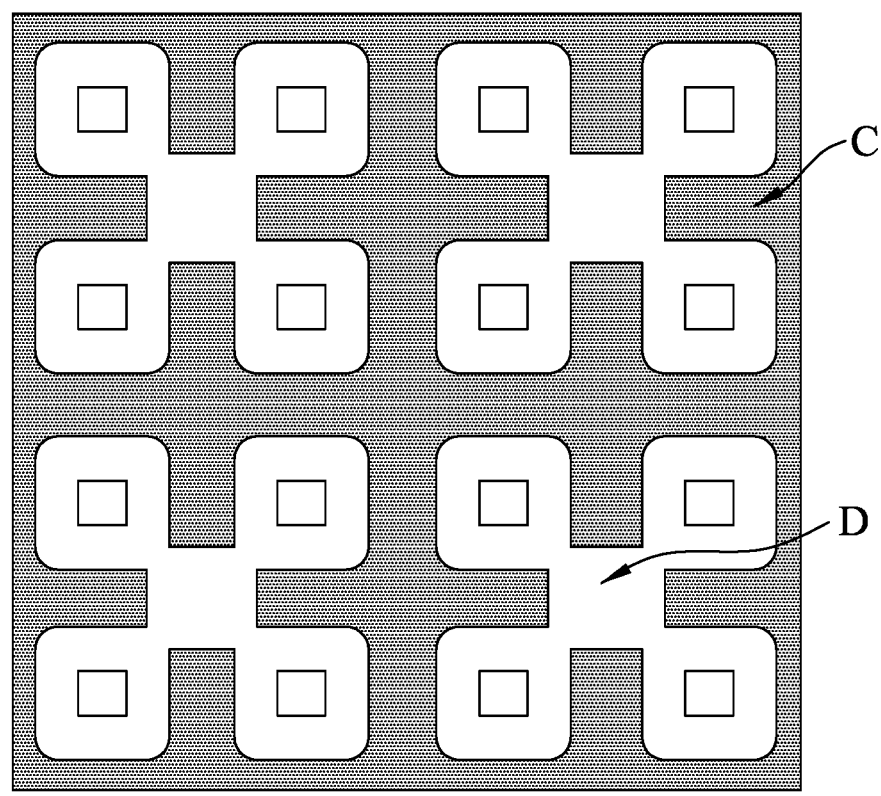

Specifically, the removing step includes a first etching sub-step and a second etching sub-step. Referring to FIGS. 14 to 18, the first etching sub-step includes etching the semiconductor epitaxial structure 100 in the to-be-removed sub-region (C) of the cutting region B until the sacrificial layer 120 is exposed. FIG. 14 corresponds to FIG. 5, FIG. 15 is a schematic sectional view taken along line c-c of FIG. 14, FIG. 16 corresponds to FIG. 7, FIG. 17 corresponds to FIG. 8, and FIG. 18 corresponds to FIG. 9.

Referring to FIGS. 19 and 20, the second etching sub-step includes partly etching the semiconductor epitaxial structure 100 in the connecting region (D) so as to retain a portion of the semiconductor epitaxial structure 100 as the connecting layer 114a. Specifically, a portion of the window film 114' is not etched to form the connecting layer 114a, which may have a thickness ranging from 50 nm to 500 nm. FIG. 19 corresponds to FIGS. 5 and 14, and FIG. 20 is a schematic sectional view taking along line d-d of FIG. 19.

Referring to FIGS. 2 and 20, after the removing step, the semiconductor epitaxial structure 100 is formed into the plurality of micro device units 100a that respectively correspond in position to the micro device unit regions (A) and that are connected in groups of two or more to the connecting layer 114a.

Referring to FIGS. 21 to 25, in step 6, the sacrificial layer 120 is removed to form a plurality of cavities 170, each of which is disposed between a respective one of the micro device unit regions (A) (see FIG. 2) and the securing layer 130.

Figure 21:
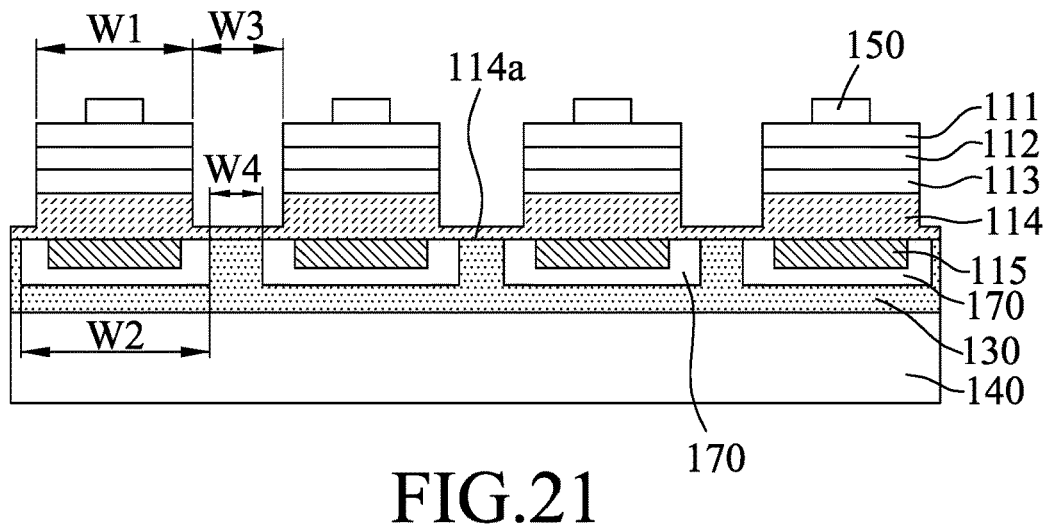
FIG. 21 is sectional schematic view of an embodiment of the micro device according to the disclosure.
Figure 22:
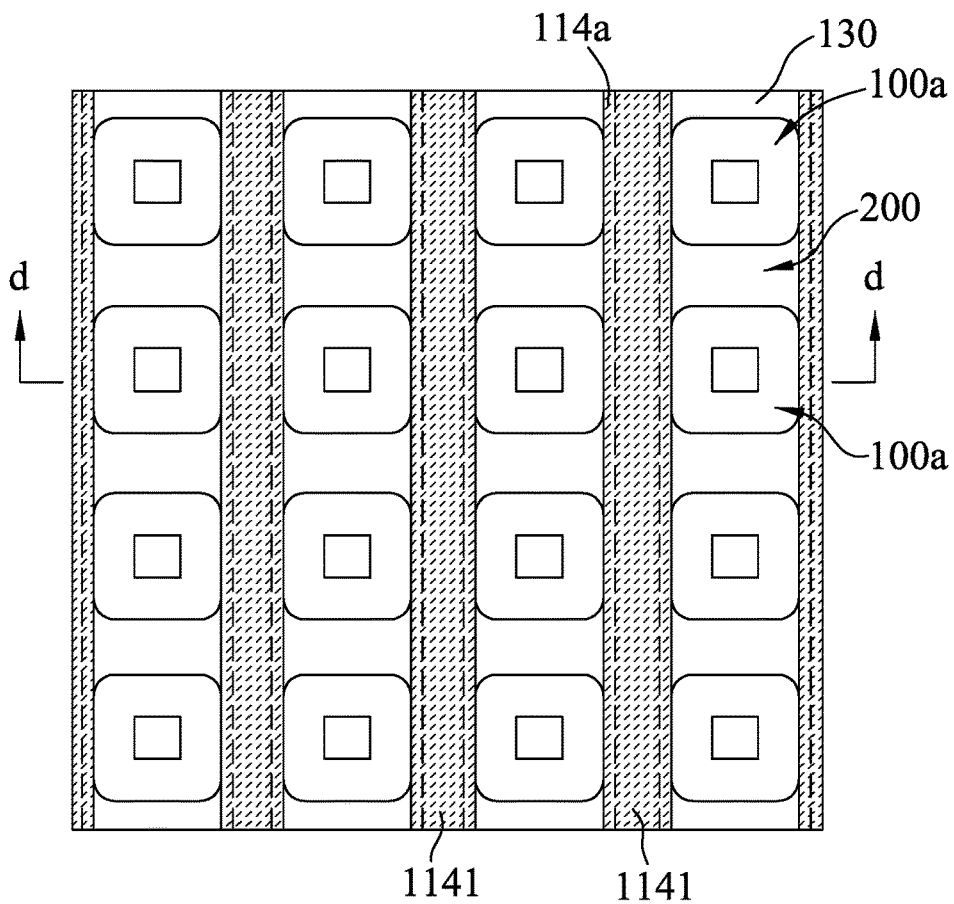
FIG. 22 is a top schematic view of the micro device.
Figure 23:
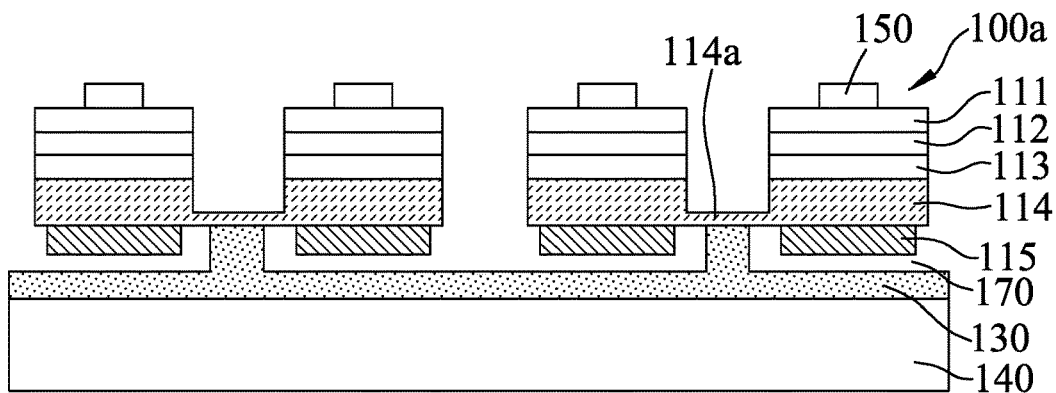
FIG. 23 is sectional schematic view of a variation of the micro device.
Figure 24:
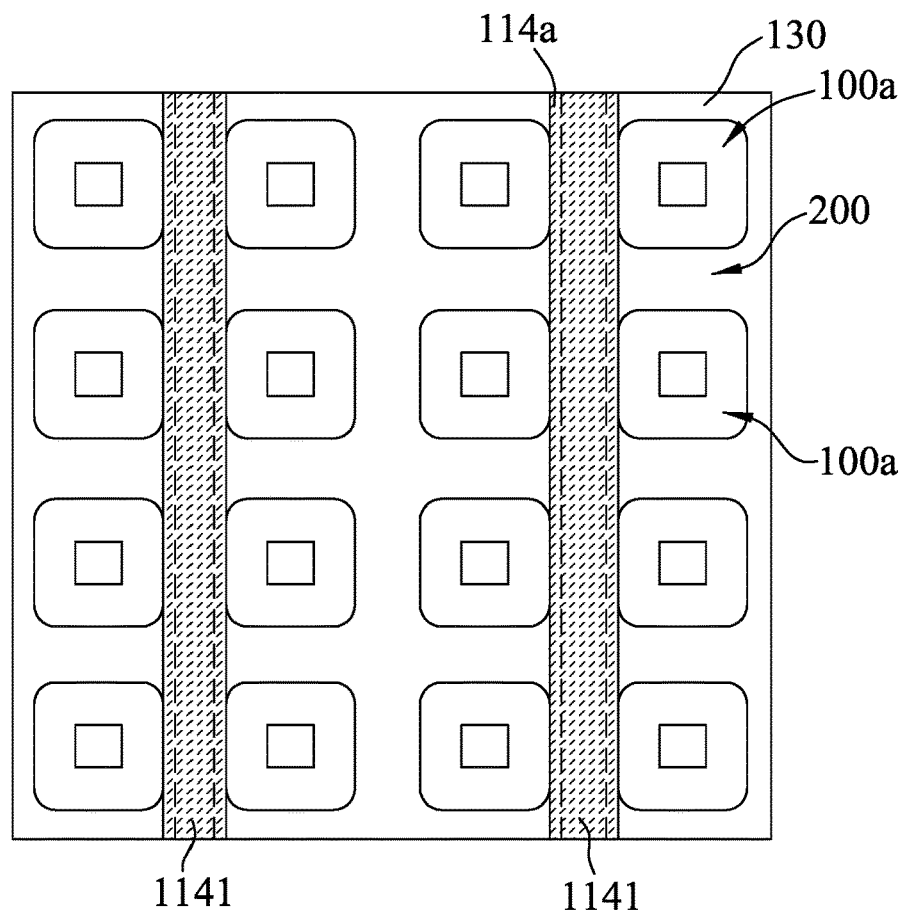
FIGS. 24 to 26 are top schematic views of other variations of the micro device.
Figure 25:
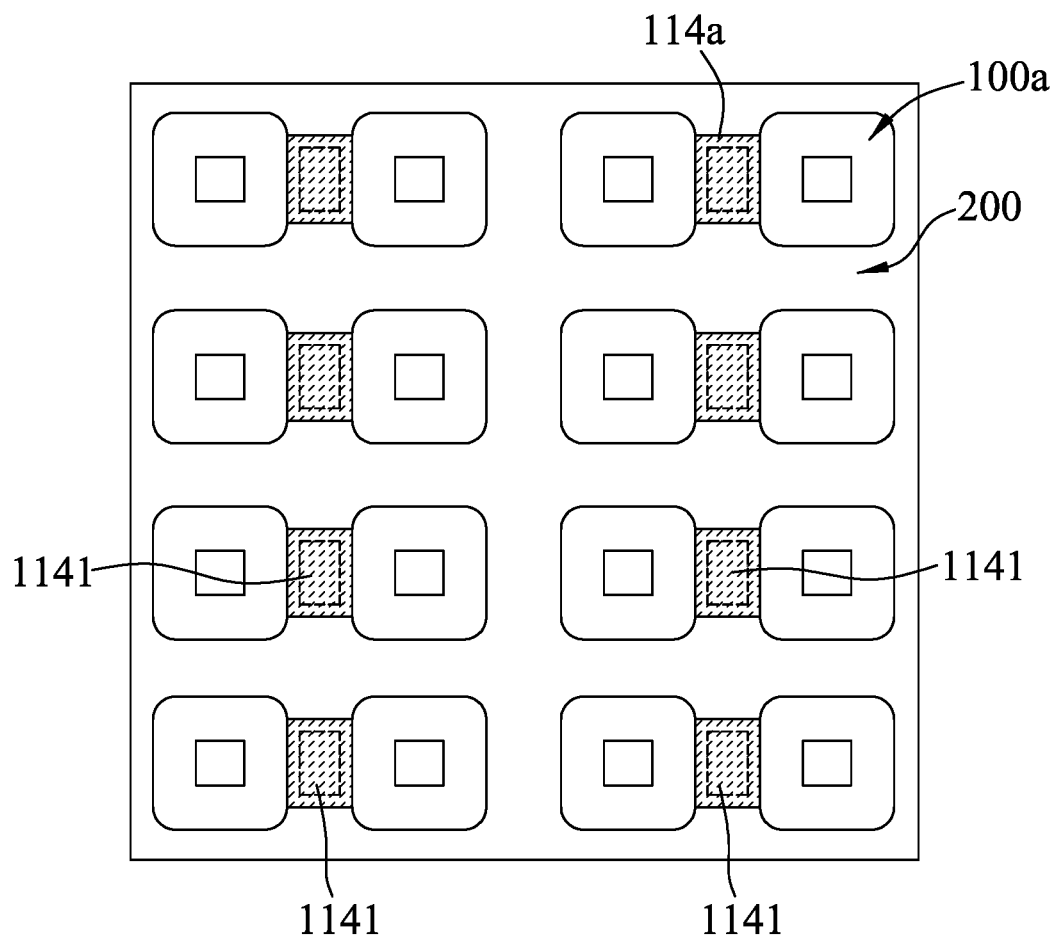
Figure 26:
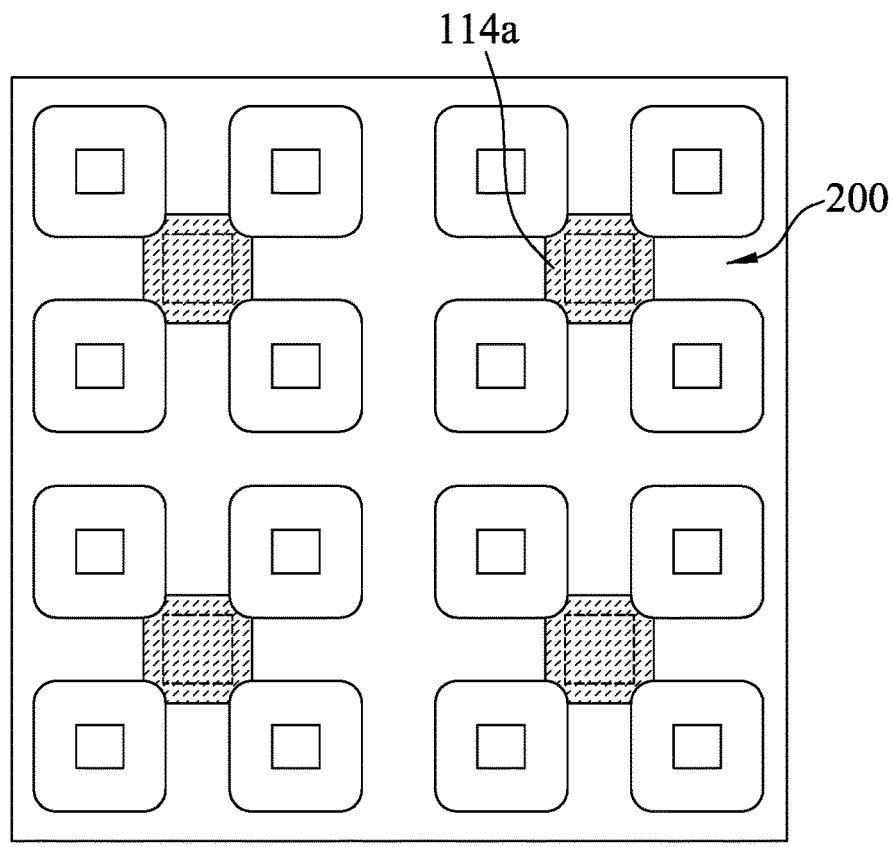

Referring to FIGS. 21 and 22, an embodiment of the micro device made using the above method is disclosed. The micro device includes the securing layer 130, the plurality of micro device units 100a, and the connecting layer 114a.

The micro device units 100a are separated from each other and spaced apart from the securing layer 130. Each of the micro device units 100a may be a light emitting diode (LED) and has a plurality of layers. In this embodiment, each of the micro device units 100a is an AlGaInP-based LED and includes the second electrode 150, an n-type semiconductor layer 111, a light emitting layer 112, a p-type semiconductor layer 113, a window layer 114, and a first electrode 115. Each of the micro device units 100a has a connecting side that is proximal to the securing layer 130.

In this embodiment, the micro device is exemplified as a plurality of red light LED on the carrier substrate 140 to be transferred to a receiving substrate (not shown). In certain embodiments, the LEDs may also be green light (with a wavelength from 495 nm to 570 nm) or blue light (with a wavelength from 450 nm to 495 nm) LEDs. In embodiments where the LEDs are the green light LEDs, materials such as indium gallium nitride (InGaN), gallium nitride (GaN), gallium phosphide (GaP), AlGaInP and aluminum gallium phosphide (AlGaP) are used. In embodiments where the LEDs are the blue light LEDs, materials such as GaN, InGaN and zinc selenide (ZnSe) are used.

The connecting layer 114a interconnects the micro device units 100a in at least one group of two or more and is connected to the securing layer 130 so that the micro device units 100a are connected to the securing layer 130 through the connecting layer 114a. The connecting layer 114a is formed integrally with and extends from the window layers 114 of the micro device units 100a, and has a thickness smaller than the window layers 114 of the micro device units 100a. In this embodiment, the connecting layer 114a has a thickness of 10 nm to 500 nm. The connecting layer 114a is made of a GaP-based material or a GaN-based material.

The connecting layer 114a including a plurality of connecting portions 1141, each of which interconnects at least two of the micro device units 100a of a respective one of the groups of the micro device units 100a, and is connected to the connecting side of each of the micro device units 100a in the respective one of the groups. Each of the connecting portions 1141 of the connecting layer 114a is formed integrally with one of the layers (i.e., in this embodiment, the window layer 114) of each of the micro device units 100a in the respective one of the groups. In other words, each of the connecting portions 1141 of the connecting layer 114a extends in a spacing amount the micro device units 100a in the respective one of the groups, and is formed by thinning at least one of the layers of each of the micro device units 100a in the respective one of the groups. In this embodiment, a length of each of the connecting portions 1141 of the connecting layer 114a between two adjacent ones of the micro device units 100a in the respective one of the groups is larger than ½ of a minimum distance between the two adjacent ones of the micro device units 100a. Each of the connecting portions 1141 of the connecting layer 114a has a striped-shape or a block-shape.

In an embodiment, the securing layer 130 is made of an adhesive material and allows the micro device units 100a to remain in suitable positions on the carrier substrate 140, and provides a structure from which the micro device units 100a may be easily picked up. The securing layer 130 and the connecting layer 114a has a contact area. The connecting layer 114a has an area parallel to and larger than the contact area. In other words, a width (W3) of each of the connecting portions 1141 in a direction transverse to the laminating direction (X) is larger than a width (W4) of the contact area in the same direction. Each of the micro device units 100a is surrounded by the securing layer 130 and cooperates with the securing layer 130 to define the cavity 170 therebetween. In an extension direction of the connecting layer 114a, each of the cavities 170 has a width (W2) being larger than a width (W1) of a respective one of the micro device units 100a. Each of the micro device units 100a has a size larger than a size of the respective cavity 170 right therebelow.

Figure 27:
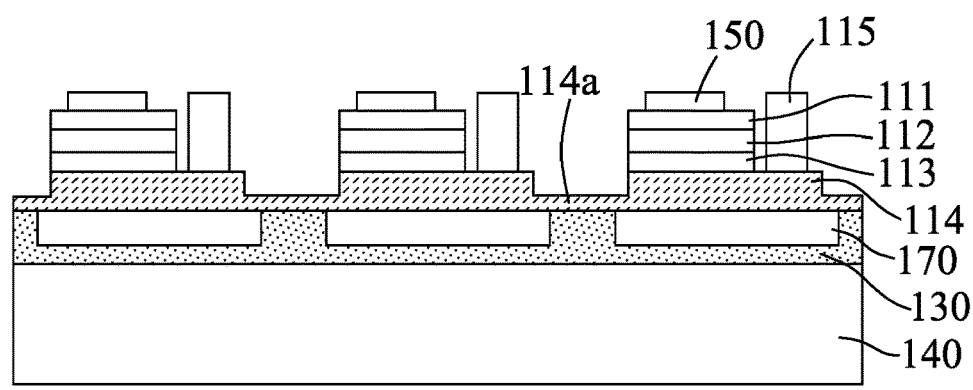
FIG. 27 is a sectional schematic view of another variation of the micro device.

In this embodiment, the micro device units 100a have a vertical structure. Referring to FIG. 27, in other embodiments, the micro device units 100a may have a lateral structure (i.e. the first and second electrodes 115, 150 being formed on the same side).

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A micro device, comprising:
   a securing layer;
   a plurality of micro device units that are separated from each other and that are spaced apart from said securing layer in a laminating direction, each of said micro device units having a plurality of layers disposed on one another along the laminating direction, being surrounded by said securing layer, and cooperating with said securing layer to define a cavity therebetween, the cavity formed squarely between the securing layer and each of the micro device units in a lateral direction or each of the laminating and lateral directions; and
   a connecting layer that directly interconnects said micro device units in at least one group of two or more and that is connected to said securing layer so that said micro device units are connected to said securing layer through said connecting layer,
   wherein said connecting layer includes a plurality of connecting portions, each of which directly interconnects said micro device units of a respective one of the groups of said micro device units in an extending direction traverse to the laminating direction, each of said connecting portions being formed integrally with and extending from at least one of said layers of each of said micro device units in the respective one of the groups, said connecting layer being made of one of a gallium phosphide based material and a gallium nitride based material, and
   wherein said cavities are formed by removing a sacrificial layer in direct contact with said micro device units and said securing layer.

2. The micro device as claimed in claim 1, wherein each of said connecting portions of said connecting layer has a thickness in the laminating direction that is smaller than a thickness of said at least one of said layers of each of said micro device units in the respective one of the groups.

3. The micro device as claimed in claim 1, wherein a length of each of said connecting portions of said connecting layer between two adjacent ones of said micro device units in the respective one of the groups is larger than ½ of a minimum distance between said two adjacent ones of said micro device units.

4. The micro device as claimed in claim 1, wherein each of said connecting portions of said connecting layer has one of a striped-shape and a block-shape.

5. The micro device as claimed in claim 1, wherein each of said micro device units is an aluminum gallium indium phosphide (AlGaInP) based LED and includes a window layer, said connecting layer being formed integrally with and extends from said window layers of said micro device units, said connecting layer having a thickness smaller than said window layers of said micro device units.

6. The micro device as claimed in claim 1, wherein said connecting layer has a thickness of 10 nm to 500 nm.

7. The micro device as claimed in claim 1, wherein said securing layer and said connecting layer has a contact area, said connecting layer having an area parallel to and larger than said contact area.

8. The micro device as claimed in claim 1, wherein, in an extension direction of said connecting layer, said cavity has a width larger than a width of a respective one of said micro device unit.

\* \* \* \* \*